United States Patent [19]

Haraszti

[11] 4,169,233
[45] Sep. 25, 1979

[54] HIGH PERFORMANCE CMOS SENSE AMPLIFIER

[75] Inventor: Tegze P. Haraszti, Garden Grove, Calif.

[73] Assignee: Rockwell International Corporation, El Segundo, Calif.

[21] Appl. No.: 880,722

[22] Filed: Feb. 24, 1978

[51] Int. Cl.² .......................... H03K 5/20; G11C 7/00
[52] U.S. Cl. ................. 307/355; 307/200 B; 307/279; 307/DIG. 3; 365/205
[58] Field of Search ................ 307/DIG. 3, 355, 362, 307/279, 291, 200 B; 365/205, 207, 208

[56] References Cited

U.S. PATENT DOCUMENTS

| | | | |
|---|---|---|---|
| 3,829,710 | 8/1974 | Hirasawa et al. | 307/205 |
| 3,838,295 | 9/1974 | Lindell | 307/DIG. 3 X |
| 3,879,621 | 4/1975 | Cavaliere et al. | 307/DIG. 3 X |
| 3,959,781 | 5/1976 | Mehta et al. | 307/279 X |
| 3,983,543 | 9/1976 | Cordaro | 307/DIG. 3 X |
| 3,983,544 | 9/1976 | Dennison et al. | 307/DIG. 3 X |
| 3,989,955 | 11/1976 | Suzuki | 307/279 X |
| 4,003,034 | 1/1977 | Au | 307/DIG. 3 X |
| 4,003,035 | 1/1977 | Hoffman et al. | 307/DIG. 3 X |
| 4,130,892 | 12/1978 | Gunckel et al. | 307/279 X |
| 4,136,292 | 1/1979 | Suzuki et al. | 307/355 |

OTHER PUBLICATIONS

Chin et al., "Low-Power Data Register"; *IBM Tech. Discl. Bull.*; vol. 15, No. 12, pp. 3891–3892; 5/1973.
Chin et al., "Sense Latch for One Device Memory Cell"; *IBM Tech. Discl. Bull.*; vol. 15, No. 11, pp. 3379–3380; 4/1973.

*Primary Examiner*—Larry N. Anagnos
*Attorney, Agent, or Firm*—H. Fredrick Hamann; G. Donald Weber, Jr.; Daniel R. McGlynn

[57] ABSTRACT

A high performance sense amplifier that is preferably fabricated from complementary metal oxide semiconductor field effect transistors (CMOSFETs) and is especially suited for applications in a radiation hardened environment. The sense amplifier of the present invention is characterized by high sensitivity, high gain, good noise immunity, low power dissipation, fast operation, relatively small geometrical size, and good stabilization for temperature and supply effects while providing self-compensation for non-uniformities of electrical parameters which may occur as the result of MOS device processing or exposure to a nuclear radiation event.

30 Claims, 11 Drawing Figures

HIGH PERFORMANCE CMOS SENSE AMPLIFIER

BACKGROUND OF THE INVENTION

1. Field of the Invention

This invention relates to a high performance sense amplifier that is fabricated from complementary metal oxide semiconductor (CMOS) devices and is suitable for sensing, reading, or writing amplifier applications with large scale integrated semiconductor memories, and the like.

2. Statement of the Prior Art

As is known to those skilled in the art, some of the primary performance characteristics that must be ideally optimized in a sense amplifier that is utilized in conjunction with a high capacity and medium or high performance memory include increased sensitivity, speed, and noise immunity and decreased space and power consumption. The conventional sense amplifier approach generally comprises a differential type amplifier with flip-flop type operation. Typically, the conventional sense amplifier is characterized by medium speed, sensitivity, and power dissipation.

While the prior art differential amplifier could be modified to improve the sensitivity, the gain and the speed of operation, the number and/or the size of the component devices thereof, and the corresponding power dissipation typically increases. In addition, the prior art differential amplifier is not adapted to tolerate non-symmetrical parameters or load on its two sides.

Some of the other problems inherent in the fabrication of the sense amplifiers of the prior art include the following. The desired precharge voltage does not match with the high gain area of the sense amplifier. That is, the precharge voltage is defined by the logical "0" and "1" signal levels occurring within a selected memory cell, by the threshold voltages of the transmission devices, by the different charge couplings and leakage currents, by capacitive and resistive load non-symmetricity, and by the offset voltage of the sense amplifier. However, the location of the high gain area of the sense amplifier is otherwise dependent upon the width-to-length ratio, the threshold voltage, the leakage current, the body effect factor, and the gain factor of the individual MOS devices which comprise the sense amplifier.

What is more, the differential type amplifiers of the prior art and the MOS devices associated therewith cannot tolerate any non-symmetrical changes in the structure of the component devices, the threshold voltages, and the parasitic capacitances, resistances and leakages, such as those caused by either device processing or by a nuclear radiation event. Any deviation from the ideal symmetrical case degrades performance rapidly and usually is accompanied by error or malfunction. More particularly, exposure of a conventional sense amplifier to a nuclear radiation event may result in both permanent degradation of MOS component parameters as well as a temporary upsetting of the sense amplifier operation. Permanent degradation in the characteristics of the semiconductor components which comprise the sense amplifier is typically caused by ionizing and neutron radiation effects. A permanent degradation in component characteristics may result in a shifting (i.e. an increase or decrease) in the threshold potentials of complementary semiconductor devices, an increase in leakage current, and a decrease in gain. The shifting of component characteristics (i.e. electrical parameters) varies with each individual component device and depends upon the voltage bias of the device electrodes that occurs during the time of radiation exposure. Additionally, temporary upsets induced by high energy, short term radiation exposure with rapid anneal effects from a nuclear event may result in momentary shifts in the parameters of the MOS components, which parameters return approximately to original parameter levels. Such rapid anneal effects are common when the sense amplifier is exposed to a large dose from x-rays, or gamma rays. The transient radiation temporarily causes extremely high leakage, transient shifts in the threshold voltages, as well as degradation in gain factor and in other parameters of the components which comprise the sense amplifier. As the rapid anneal effects dissipate with time, the parameters of the components subsequently and approximately recover to the level of permanent degradation.

The following patents show examples of prior art sensing arrangements:

U.S. Pat. No. 4,003,035 Jan. 11, 1977;
U.S. Pat. No. 4,003,034 Jan. 11, 1977;
U.S. Pat. No. 3,959,781 May 25, 1976,
U.S. Pat. No. 3,909,739 Sept. 30, 1975.

However, none of the aforementioned patents discloses a CMOS sense amplifier comprising first and second cross-coupled inverter-amplifier stages having series or parallel connected compensating components which automatically compensate for the effects of electrical parameter non-uniformities that may occur as a result of MOS device processing or exposure to a radiation event. Moreover, none of the aforementioned patents shows a sense amplifier which utilizes the body effect (such as that available in a MOS transistor device fabricated by silicon on sapphire techniques) to achieve self-compensation, as provided by some of the embodiments of the present invention.

SUMMARY OF THE INVENTION

Briefly, and in general terms, a high performance sense amplifier is disclosed that, in a preferred embodiment, is fabricated from complementary metal oxide semiconductor (CMOS) field effect transistors (FETs) with silicon on sapphire (SOS) technology. In one embodiment of the present invention, the sense amplifier is comprised of first and second complementary pairs of series connected p and n-channel FETs forming cross-connected inverter-amplifier stages with or without feedback. The source electrodes of the p-channel FETs that comprise the inverter-amplifiers are connected together at an electrical junction. Another p-channel FET is connected between this electrical junction and a source of relatively positive source voltage. The gate electrode of the additional p-channel FET is supplied with a clock control signal. The source electrodes of the n-channel FETs that comprise the inverter-amplifiers are also connected together at an electrical junction. Another n-channel FET is connected between this last mentioned electrical junction and a source of relatively negative source voltage. The gate electrode of the additional n-channel FET is also supplied with a clock control signal. By virtue of the present invention, the sense amplifier achieves high sensitivity, high gain, optimum noise immunity, and low power dissipation, inasmuch as the complementary field effect transistor pairs operate with the sum of their respective drain-source voltages equal to the sum of the threshold voltages of a pair of complementary field effect transistors.

In another embodiment of the present invention, a self-compensating sense amplifier is provided which automatically compensates for geometrical non-uniformities that may occur as a result of MOS device processing or from exposure to a nuclear radiation event. Self-compensation is achieved by arranging either series or parallel connected compensating elements (resistors, FETs, and the like) with the first and second pairs of complementary series connected field effect transistors so as to automatically control the respective drain currents in each of the first and second transistor pairs. Moreover, self-compensation may also be achieved by utilizing the body effect on MOS device threshold voltages by fabricating both the complementary transistor pairs and the compensating elements with silicon on sapphire techniques, or the like.

DESCRIPTION OF THE PREFERRED EMBODIMENT

Figure 1:
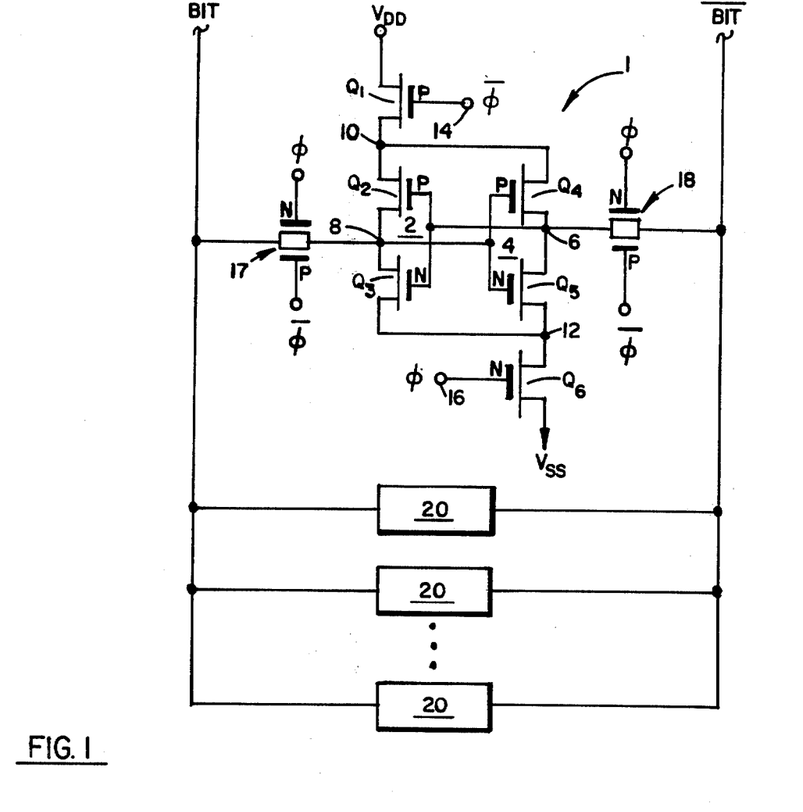
FIG. 1 shows a high performance CMOS sense amplifier formed in accordance with the present invention.

FIG. 1 of the drawings shows a preferred embodiment of a complementary metal oxide semiconductor (CMOS) sense amplifier 2 with maximized signal sensitivity, speed, noise immunity, and gain and minimized size and power dissipation. In accordance with the present invention, the sense amplifier 1 is formed by first and second cross-coupled inverting amplifier stages 2 and 4. Inverter-amplifier stage 2 is comprised of a pair of series connected field effect transistors (FETs) $Q_2$ and $Q_3$. Inverter-amplifier stage 4 is comprised of a pair of series connected field effect transistors (FETs) $Q_4$ and $Q_5$. Each of the gate electrodes of FETs $Q_2$ and $Q_3$ are connected together at a first electrical junction and input terminal 6 formed between the series connected conduction paths of FETs $Q_4$ and $Q_5$. Each of the gate electrodes of FETs $Q_4$ and $Q_5$ are connected together at a second electrical junction and input terminal 8 formed between the series connected conduction paths of FETs $Q_2$ and $Q_3$ so that the cross-coupled inverter stages 2 and 4 provide feedback signals to one another. The series connected conduction paths of FETs $Q_2$ and $Q_3$ are connected in electrical parallel with the series connected conduction paths of FETs $Q_4$ and $Q_5$ between a pair of electrical junctions 10 and 12.

A first FET $Q_1$ is connected between a source of relatively positive supply voltage $V_{DD}$ and the electrical junction 10. The gate electrode of FET $Q_1$ is connected to a clock terminal means 14 to receive a first clock signal $\bar{\phi}$. A second FET $Q_6$ is connected between electrical junction 12 and a source of relatively negative supply voltage $V_{SS}$, such as, for example, ground. The gate electrode of FET $Q_6$ is connected to a clock terminal means 16 to receive a second clock signal $\phi$. The first and second clock signals may be complements of one another. FETs $Q_1$ and $Q_6$ are rendered conducting by the respective clock signals $\bar{\phi}$ and $\phi$ so as to clamp electrical junctions 10 and 12, with suitable varying resistance, to one of the supply voltages $V_{DD}$ or $V_{SS}$. In a preferred embodiment, FETs $Q_1$, $Q_2$, and $Q_4$ are p-channel transistor devices, while FETs $Q_3$, $Q_5$, and $Q_6$ are n-channel transistor devices. Moreover, for minimizing voltage and current offset, FETs $Q_2$ and $Q_4$ as well as $Q_3$ and $Q_5$ are identically sized devices.

To separate the presently disclosed sense amplifier 1 from any one of a plurality of memory cells 20 comprising a suitable array thereof or to precharge input terminals 6 and 8 independently from the data bus lines, well known coupling means are connected between the sense amplifier 1 and a pair of the data bus lines. More particularly, a first coupling transistor means 17 is connected between the input electrical junction 8 and a BIT data bus line. A second coupling means 18 is connected between the input electrical junction 6 and an opposite state $\overline{BIT}$ data bus line. By way of example, coupling transistor means 17 and 18 may each comprise a pair of complementary field effect transistors having their respective conduction paths connected in electrical parallel with one another between a sense amplifier input terminal 6 or 8 and a corresponding data bus line. However, the coupling transistor means 17 and 18 may also be fabricated from single devices or, depending on the memory organization, they may be eliminated entirely. The conductivity of each of the pair of coupling transistors is controlled by the clock signals $\bar{\phi}$ and $\phi$ applied to the respective gate electrodes thereof. The presently disclosed sense amplifier 1 may be interfaced with an array of memory cells 20 via the BIT and $\overline{BIT}$ data bus lines in any well known configurations, such as a row amplifier arrangement, a pipe lined amplifier arrangement, or the like.

The operation of the presently disclosed CMOS sense amplifier 1 having optimized performance is described as follows. During the start of operation, disabling clock control signals $\bar{\phi}$ and $\phi$ are supplied from clock terminal means 14 and 16 to the respective gate electrodes of FETs $Q_1$ and $Q_6$, and FETs $Q_1$ and $Q_6$ are rendered non-conducting. Although the electrical potentials applied to electrical junctions 10 and 12 are floating, the voltage of electrical junction 10 is nearly that of the $V_{DD}$ supply voltage, and the voltage of electrical junction 12 is nearly that of the $V_{SS}$ supply voltage. Precharge voltages more positive than the sum of the $V_{SS}$ supply voltage and the threshold voltage drop of an n-channel FET and more negative than the difference between $V_{DD}$ supply voltage and the threshold voltage drop of a p-channel FET are respectively applied to each of the electrical junctions 6 and 8 and to the gate electrodes of FETs $Q_2$, $Q_3$, $Q_4$ and $Q_5$ so as to render conducting each of FETs $Q_2$–$Q_5$. After developing the proper precharge voltages, the voltage at electrical junction 10 is equivalent to the sum of the precharge voltage plus the threshold voltage drop $V_{tp}$ of the p-channel FET $Q_2$. The voltage at electrical junction 12 is equivalent to the difference between the precharge voltage and the threshold voltage drop $V_{tn}$ of the n-channel FET $Q_5$. Therefore, the voltage difference between electrical junctions 10 and 12 is equivalent to the sum of the threshold voltage drops of the p-channel FET $Q_2$ (or $Q_4$) and the n-channel FET $Q_5$ (or $Q_3$), i.e.: $|V_{tp}| + V_{tn}$, which, thereby, automatically results in a nearly rectangular function of input-output transfer characteristics regardless of the size of the amplifier component devices and automatically places the initial operating point into the center of this rectangular function regardless of varying device parameters, temperature, supply voltage, or radiation effects. Thus, the sense amplifier 1 begins to work automatically at the optimum operating point where the highest sensitivity, highest gain, best noise immunity, and lowest power dissipation of any amplifier can be achieved whenever FETs $Q_1$ and $Q_6$ are rendered conducting by the $\bar{\phi}$ and $\phi$ clock signals.

When a particular memory cell 20 from the array thereof is selectively accessed, the potentials at electrical junctions 6 and 8 are respectively increased and decreased, or vice versa, in accordance with the information stored in the selected memory cell. After the selected memory cell 20 is accessed, FETs $Q_1$ and $Q_6$ are relatively slowly rendered conducting. During this slow conduction of FETs $Q_1$ and $Q_6$, the sense amplifier works close to the initial ideal operating point. However, after the proper potential difference has been achieved between electrical junctions 6 and 8, high sense amplifier sensitivity is no longer critical, and the clock signals $\bar{\phi}$ and $\phi$ that are supplied to the gate electrodes of FETs $Q_1$ and $Q_6$ cause FETs $Q_1$ and $Q_6$ to be rendered fully conducting to thereby provide to the electrical junctions 6 and 8, in a relatively short time, a maximum logic "1" signal level (that is equivalent to the $V_{DD}$ supply voltage) and a minimum logic "0" signal level (that is equivalent to the $V_{SS}$ supply voltage). Unlike those sense amplifiers of the prior art, because of the nearly ideal transfer characteristics and the automatic ideal operating point adjustment, the present sense amplifier 1 is characterized by small integrable size, while achieving optimum performance for sensitivity, gain, noise immunity, and power dissipation. However, the sense amplifier 1 remains responsive to the non-symmetricity of devices, load, or parasitic effects on either of the two cross-coupled inverter-amplifier stages 2 and 4.

Immunity from non-uniformities as a result of device processing or from imbalances caused by exposure to a nuclear radiation event is provided by arranging MOS devices, according to the following embodiments of the present invention, so as to form sense amplifier configurations which automatically compensate for the undesirable effects of non-symmetry and for degradation in the characteristics of the semiconductor components caused by ionizing radiation, neutron and transient annealing effects.

Figure 2:
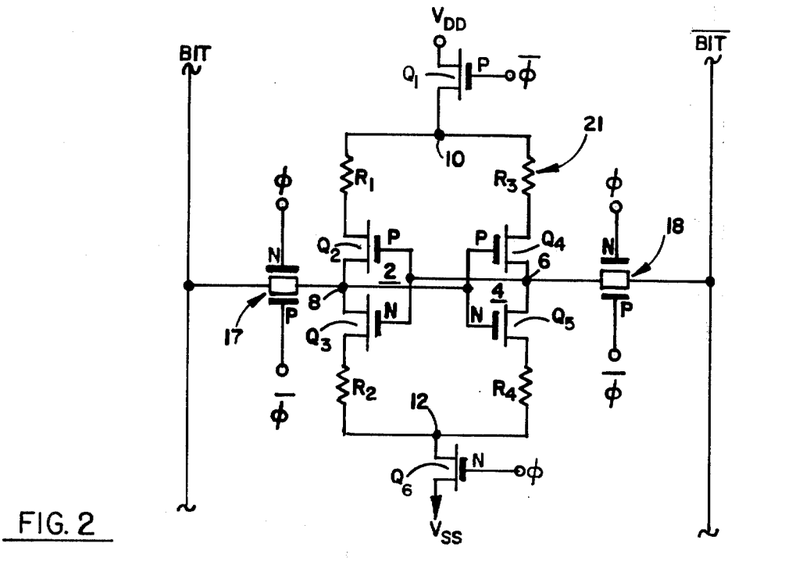
FIGS. 2-8 each show a high performance, self-compensating CMOS sense amplifier formed in accordance with another embodiment of the present invention.

FIG. 2 shows a self-compensating CMOS sense circuit 21 that operates in the linear MOS region and has both read and write capabilities. The sense circuit 21 is identical to the sense circuit 1 of FIG. 1, except for the addition of compensating resistors $R_1$–$R_4$. Referring to FIG. 2, resistor $R_1$ is connected in electrical series with FET $Q_2$ between electrical junctions 10 and 8. Resistor $R_2$ is connected in electrical series with FET $Q_3$ between electrical junctions 8 and 12. Resistor $R_3$ is connected in electrical series with FET $Q_4$ between electrical junctions 10 and 6. Resistor $R_4$ is connected in electrical series with FET $Q_5$ between electrical junctions 6 and 12.

In operation, resistors $R_1$–$R_4$ enable the presently disclosed sense amplifier 21 to achieve high sensitivity relative to the level of the information signals on the BIT and $\overline{BIT}$ data bus lines by supplying individual compensation to the critical MOS devices (e.g. FETs $Q_3$ and $Q_5$) to prevent sense amplifier failure as an undesirable result of either temperature or radiation induced threshold voltage changes. The effective transconductance $g_m'$ of the sense amplifier 21 is represented by:

$$g_m' = g_m/(1 + R_s g_m),$$

where $g_m$ depends upon transistor device parameters such as threshold voltages, mobility, geometry, etc. However, if $R_s$ (e.g. $R_1$–$R_4$)$\gg 1$, then $g_m'$ is approximately equal to $1/R_s$, so that, by virtue of the present sense amplifier 21, $g_m$ becomes virtually independent of the transistor device parameter changes.

Figure 3:
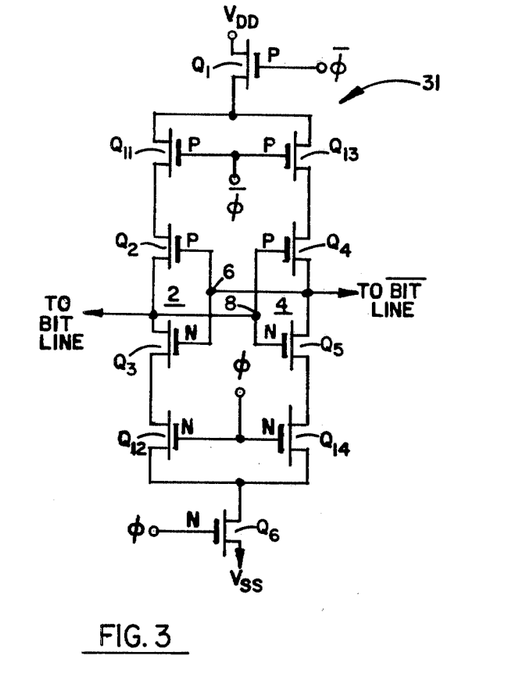
Figure 4:
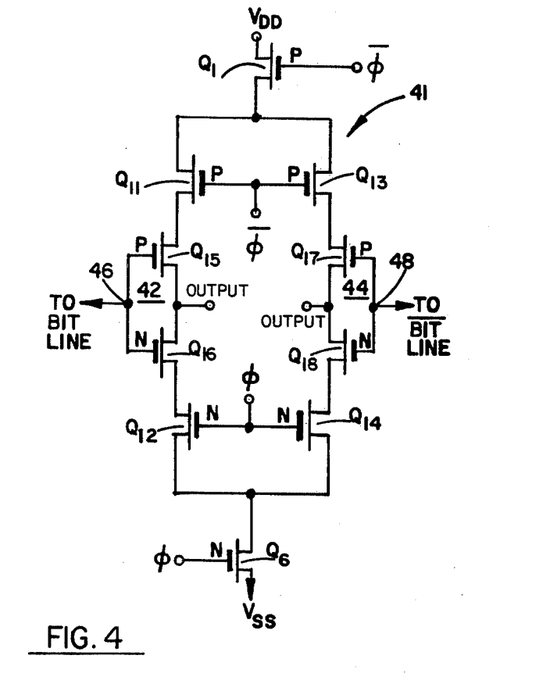

In two similar self-compensating CMOS sense amplifiers 31 and 41, the compensating resistors $R_1$–$R_4$ of FIG. 2 are replaced by compensating FET devices $Q_{11}$–$Q_{14}$ that operate in the triode region, as illustrated in FIGS. 3 and 4. FETs $Q_{11}$–$Q_{14}$ decrease the required silicon area while facilitating the utilization of a simplified process technique and decreasing the processing and masking strips. However, the radiation hardness of the sense amplifiers 31 and 41 is usually weaker, inasmuch as FET devices are more sensitive to radiation than are hardened resistors.

Each of the sense amplifiers 31 and 41 is identically comprised of the aforementioned four compensating FETs $Q_{11}$–$Q_{14}$. Sense amplifier 31 also includes first and second cross-coupled inverter-amplifier stages 2 and 4, having cross-connected FETs $Q_2$–$Q_5$, identical to that illustrated in FIG. 1. The sense amplifier 41 includes first and second inverter-amplifier stages 42 and 44, comprising respective pairs of series connected FETs $Q_{15}$, $Q_{16}$ and $Q_{17}$, $Q_{18}$, which FETs are not cross-connected so that no feedback signals are supplied to one another. Therefore, the sense amplifier 41 of FIG. 4 can be characterized as having a high input impedance, while providing inverted output signals at electrical junctions 46 and 48. Each of the gate electrodes of the compensating FETs $Q_{11}$ and $Q_{13}$ of both of the sense amplifiers 31 and 41 are connected together and to the clock terminal means to receive the $\bar{\phi}$ clock signal. Moreover, each of the gate electrodes of the compensating FETs $Q_{12}$ and $Q_{14}$ of both of the sense amplifiers 31 and 41 are connected together and to the clock terminal means to receive the $\phi$ clock signal. An electrical junction between the series connected conduction paths of inverter-amplifier FETs $Q_{15}$ and $Q_{16}$ of sense amplifier 41 is connected together to form a first output. An electrical junction between the series connected conduction paths of inverter-amplifier FETs $Q_{17}$ and $Q_{18}$ of sense amplifier 41 is connected together to form a second output. The conduction path of a first additional FET $Q_1$ is connected between the relatively positive source of supply voltage $V_{DD}$ and one conduction path electrode of each of the compensating FETs $Q_{11}$ and $Q_{13}$ of sense amplifiers 31 and 41. The gate electrode of FET $Q_1$ is connected to clock terminal means to receive the $\bar{\phi}$ clock signal. The conduction path of a second additional FET $Q_6$ is connected between one conduction path electrode of each of the compensating FETs $Q_{12}$ and $Q_{14}$ of sense amplifiers 31 and 41 and the relatively negative source of supply voltage $V_{SS}$. The gate electrode of FET $Q_6$ is connected to clock terminal means to receive the $\phi$ clock signal. In a preferred embodiment, compensating FETs $Q_{11}$ and $Q_{13}$ are p-channel transistor devices, while compensating FETs $Q_{12}$ and $Q_{14}$ are n-channel transistor devices.

Figure 5:
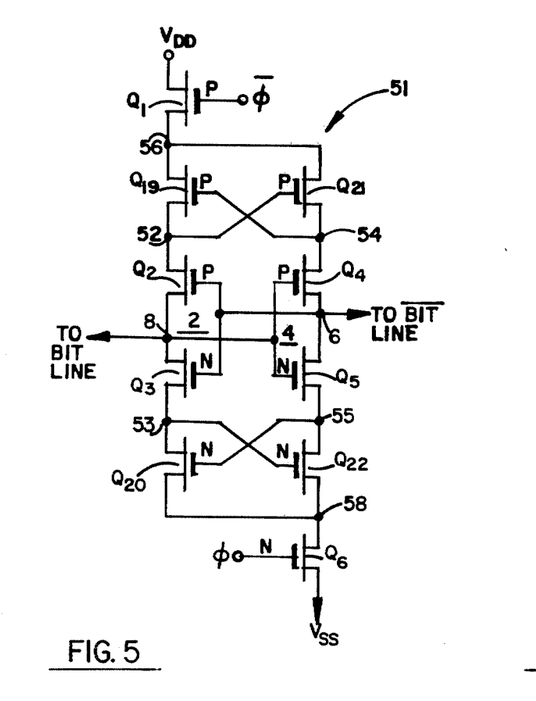

Another self-compensating CMOS sense amplifier 51 is illustrated in FIG. 5. The presently disclosed sense amplifier 51 includes a pair of cross-coupled inverter-amplifier stages 2 and 4, comprising FETs $Q_2$–$Q_5$, as previously illustrated in FIG. 1, and four cross-connected compensating FETs $Q_{19}$–$Q_{22}$. The conduction path of a first compensating FET $Q_{19}$ is connected between electrical junctions 52 and 56 and in electrical series with FET $Q_2$. The conduction path of a second compensating FET $Q_{21}$ is connected between electrical junctions 54 and 56 and in electrical series with FET $Q_4$. The gate electrodes of FETs $Q_{19}$ and $Q_{21}$ are cross-connected to electrical junctions 54 and 52, respectively. The conduction path of a third compensating FET $Q_{20}$ is connected between electrical junctions 53 and 58 and in electrical series with FET $Q_3$. The conduction path of a fourth compensating FET $Q_{22}$ is connected between electrical junctions 55 and 58 and in electrical series with FET $Q_5$. The gate electrodes of FETs $Q_{20}$ and $Q_{22}$ are cross-connected to electrical junctions 55 and 53, respectively. The conduction path of a first additional FET $Q_1$ is connected between the relatively positive source of supply voltage $V_{DD}$ and the electrical junction 56. The gate electrode of the FET $Q_1$ is connected to clock terminal means to receive the $\phi$ clock signal. The conduction path of a second additional FET $Q_6$ is connected between the electrical junction 58 and the source of relatively negative supply voltage $V_{SS}$. The gate electrode of the FET $Q_6$ is connected to clock terminal means to receive the $\bar{\phi}$ clock signal. In a preferred embodiment, FETs $Q_1$, $Q_2$, $Q_4$, $Q_{19}$, and $Q_{21}$ are p-channel transistor devices, and FETs $Q_3$, $Q_5$, $Q_6$, $Q_{20}$, and $Q_{22}$ are n-channel transistor devices.

The operation of the self-compensating sense amplifier 51 of FIG. 5 is briefly described as follows. Under ideal operating conditions, the respective drain currents in each of the cross-coupled inverter FETs $Q_3$ and $Q_5$ are identical. However, should an undesirable geometrical non-uniformity or an exposure to a radiation event cause an amplifier variation such as, for example, in the threshold potential, leakage current, or gain factor in one of the cross-coupled inverter-amplifier stages 2 or 4, the drain current of one of the first inverter FETs $Q_3$ exceeds the corresponding drain current of one of the second inverter FETs $Q_5$, inasmuch as the source-drain resistance of FET $Q_3$ becomes less than that of FET $Q_5$. Hence, the voltage at electrical junction 53 exceeds the corresponding voltage at electrical junction 55, and, as a result, FET $Q_{22}$ turns on harder than FET $Q_{20}$. Therefore, the source-drain resistance of FET $Q_{22}$ is effectively reduced relative to the source-drain resistance of FET $Q_{20}$, so that the voltage at electrical junction 55 is decreased and the voltage at electrical junction 53 is correspondingly increased. By virtue of the self-compensating sense amplifier 51, the sum of the source-drain resistances of the series connected FETs $Q_3$ and $Q_{20}$ approximates that of FETs $Q_5$ and $Q_{22}$, whereby the drain currents of FETs $Q_3$ and $Q_5$ are approximately equalized.

Figure 6:
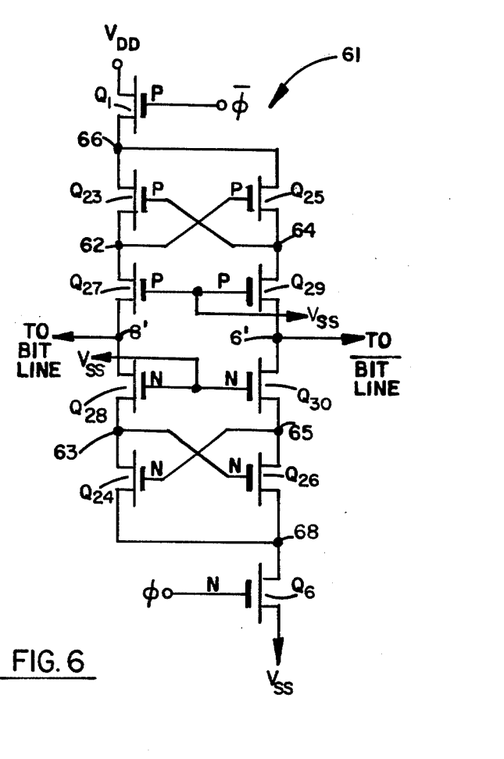

Another self-compensating CMOS sense amplifier 61 is illustrated in FIG. 6. Sense amplifier 61 is comprised of an arrangement of four compensating FETs $Q_{23}$, $Q_{24}$, $Q_{25}$ and $Q_{26}$. In addition to the compensating FETs $Q_{23}$–$Q_{26}$, the conduction paths of a pair of FETs $Q_{27}$ and $Q_{28}$ are connected in electrical series with one another between electrical junctions 62 and 63. The conduction paths of another pair of FETs $Q_{29}$ and $Q_{30}$ are connected in electrical series with one another between electrical junctions 64 and 65. The respective gate electrodes of FETs $Q_{27}$ and $Q_{29}$ are connected together at the source of relatively negative supply voltage $V_{SS}$. The respective gate electrodes of FETs $Q_{28}$ and $Q_{30}$ are also connected together at the source of relatively negative supply voltage $V_{SS}$. Unlike the sense amplifier of FIG. 1, the gate electrodes of FETs $Q_{27}$–$Q_{30}$ are not cross-connected relative to one another, so that the presently disclosed sense amplifier 61 operates without inverter feedback, with a high sense input impedance at input electrical junctions 6' and 8', and with a minimum number of transfer devices.

One conduction path electrode of a first compensating FET $Q_{23}$ is connected at the electrical junction 66. The second conduction path electrode of FET $Q_{23}$ and the gate electrode of a second compensating FET $Q_{25}$ are connected together at the electrical junction 62. One conduction path electrode of the compensating FET $Q_{25}$ is connected at the electrical junction 66. The second conduction path electrode of FET $Q_{25}$ and the gate electrode of compensating FET $Q_{23}$ are connected together at the electrical junction 64. A first additional FET $Q_1$ is connected between the electrical junction 66 and the source of relatively positive supply voltage $V_{DD}$. The gate electrode of FET $Q_1$ is connected to clock terminal means to receive the $\bar{\phi}$ clock signal. In a preferred embodiment, FETs $Q_1$, $Q_{23}$, $Q_{25}$, $Q_{27}$, and $Q_{29}$ are p-channel transistor devices.

One conduction path electrode of a third compensating FET $Q_{24}$ is connected to the electrical junction 68. The second conduction path electrode of compensating FET $Q_{24}$ and the gate electrode of a fourth compensating FET $Q_{26}$ are connected together at the electrical junction 63. One conduction path electrode of compensating FET $Q_{26}$ is connected to the electrical junction 68. The second conduction path electrode of FET $Q_{26}$ and the gate electrode of FET $Q_{24}$ are connected together at the electrical junction 65. The conduction path of a second additional FET $Q_6$ is connected between electrical junction 68 and the source of relatively negative supply voltage $V_{SS}$. The gate electrode of FET $Q_6$ is connected to clock terminal means to receive the $\bar{\phi}$ clock signal. In a preferred embodiment, FETs $Q_6$, $Q_{24}$, $Q_{26}$, $Q_{28}$, and $Q_{30}$ are n-channel transistor devices.

The operation of the self-compensating sense amplifier 61 of FIG. 6 is briefly described as follows. Under ideal operating conditions, the drain currents of each of FETs $Q_{28}$ and $Q_{30}$ are identical. However, should the drain current of FET $Q_{28}$ exceed that of FET $Q_{30}$ due to an unbalance, such as that caused by a device parameter nonuniformity or by a nuclear radiation event, the corresponding voltage at electrical junction 63 exceeds that at electrical junction 65. Hence, FET $Q_{26}$ turns on harder than FET $Q_{24}$, and, as a result, the sum of the source-drain resistances of the series connected FETs $Q_{30}$ and $Q_{26}$ approximates that of the series connected FETs $Q_{28}$ and $Q_{24}$. Therefore, by virtue of the disclosed self-compensating sense amplifier 61, the drain currents of each of FETs $Q_{28}$ and $Q_{30}$ are approximately equalized. What is more, maximized logic level "0" and "1" signals (i.e. $V_{DD}$ and $V_{SS}$) can be generated by the sense amplifier 61 at electrical junctions 6' and 8', which signals are clearly distinguishable from one another.

Figure 7:
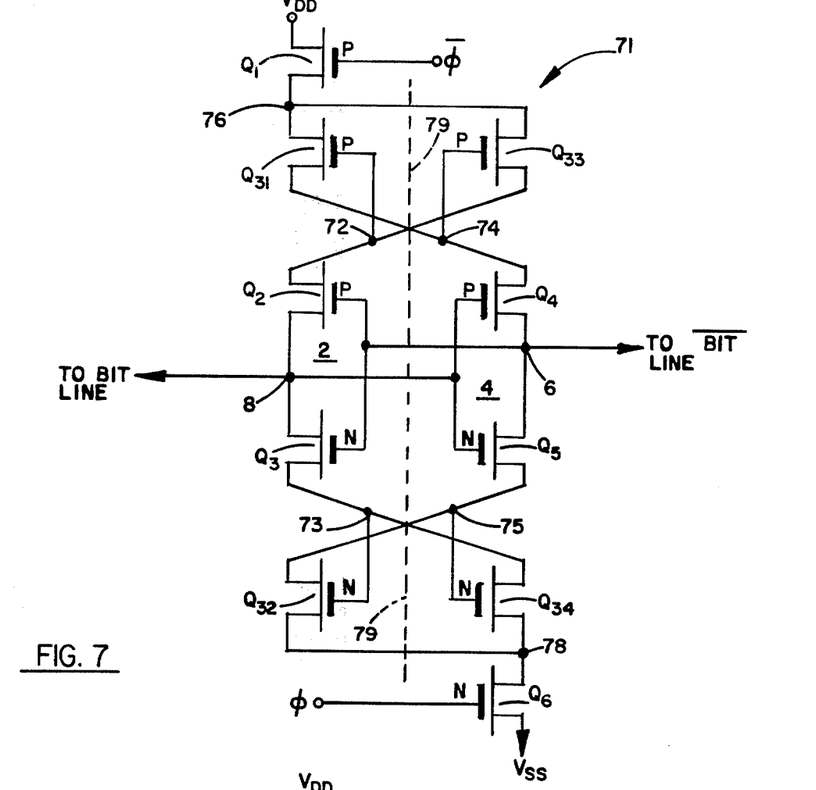

Another form of the self-compensating CMOS sense amplifier configuration illustrated in FIG. 6 is that shown in FIG. 7. The sense amplifier 71 of FIG. 7 includes a pair of cross-coupled inverter-amplifier stages 2 and 4, comprising FETs $Q_2$–$Q_5$ and an arrangement of four compensating FETs $Q_{31}$, $Q_{32}$, and $Q_{34}$ (identical to those illustrated in FIG. 5). One conduction path electrode of each of the compensating FETs $Q_{31}$ and $Q_{33}$ are connected together at an electrical junction 76. The gate electrode of compensating FET $Q_{31}$ is connected at an electrical junction 72 with the second conduction path electrode of compensating FET $Q_{33}$ and one conduction path electrode of FET $Q_2$. The second conduction path electrode of FET $Q_{31}$ is connected at an electrical junction 74 with the gate electrode of FET $Q_{33}$ and one conduction path electrode of FET $Q_4$. Thus, the conduction paths of FETs $Q_{31}$ and $Q_4$ and FETs $Q_{33}$ and $Q_2$ are connected in electrical series. One conduction path electrode of each of the compensating FETs $Q_{32}$ and $Q_{34}$ are connected together at an electrical junction 78. The second conduction path electrode of compensating FET $Q_{32}$ and the gate electrode of compensating FET $Q_{34}$ are connected together at an electrical junction 75 with one conduction path electrode of FET $Q_5$. The second conduction path electrode of FET $Q_{34}$ and the gate electrode of FET $Q_{32}$ are connected together at an electrical junction 73 with one conduction path electrode of FET $Q_3$. Thus, the conduction paths of FETs $Q_3$ and $Q_{34}$ and FETs $Q_5$ and $Q_{32}$ are connected in electrical series. The conduction path of the first additional FET $Q_1$ is connected between the source of relatively positive supply voltage $V_{DD}$ and the electrical junction 76. The gate electrode of FET $Q_1$ is connected to clock terminal means to receive the $\bar{\phi}$ clock signal. The conduction path of a second additional FET $Q_6$ is connected between the electrical junction 78 and the relatively negative source of supply voltage $V_{SS}$. The gate electrode of FET $Q_6$ is connected to clock terminal means to receive the $\phi$ clock signal. In a preferred embodiment, FETs $Q_1$, $Q_2$, $Q_4$, $Q_{31}$, and $Q_{33}$ are p-channel transistor devices, while FETs $Q_3$, $Q_5$, $Q_6$, $Q_{32}$, and $Q_{34}$ are n-channel transistor devices.

It is pointed out that while the mechanization and operation of the sense amplifier 71 of FIG. 7 are electrically identical to that of the sense amplifier 51 of FIG. 5, the sense amplifier 71 may have certain geometrical advantages. More particularly, on the silicon surface, each of FETs $Q_2$, $Q_3$, $Q_{31}$, and $Q_{32}$ is geometrically arranged on one side of symmetrical axis 79, and each of the FETs $Q_4$, $Q_5$, $Q_{33}$, and $Q_{34}$ is arranged on the other side of axis 79. This symmetrical arrangement of FET devices achieves a compensating effect during processing to account for misalignments from fabrication. For example, if the gain of a FET $Q_5$ is higher than that of $Q_3$ as a result of different channel widths, the gain of FET $Q_{34}$ is usually also higher than that of FET $Q_{32}$. Since FET $Q_3$ is connected in electrical series with FET $Q_{34}$ and FET $Q_5$ is connected in electrical series with FET $Q_{32}$, any resulting gain difference is minimized.

Figure 8:
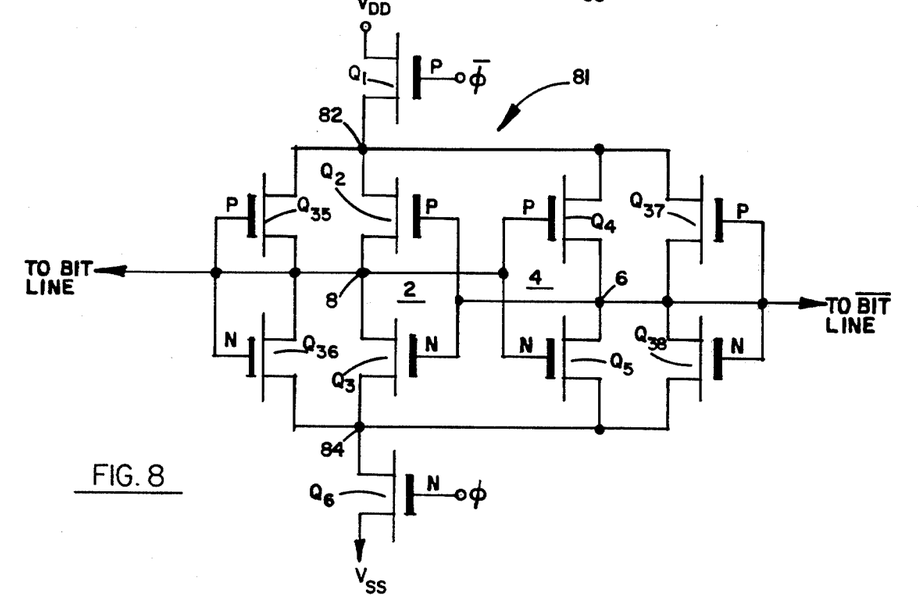

Another self-compensating CMOS sense amplifier 81 which compensates for the effects of processing, temperature and radiation induced parameter changes in MOS devices is illustrated in FIG. 8. Unlike those sense amplifiers illustrated in FIGS. 2-7 that include an arrangement of series connected compensating devices, FIG. 8 shows a sense amplifier 81 having parallel connected MOS compensating devices. More particularly, the disclosed self-compensating sense amplifier 81 includes first and second cross-coupled inverter-amplifier pairs of series connected FETs $Q_2$, $Q_3$ and $Q_4$, $Q_5$ identical to that illustrated in FIG. 1. The conduction path of a first compensating FET $Q_{35}$ is connected in electrical parallel with inverter FET $Q_2$ between electrical junctions 82 and 8. The conduction path of a second compensating FET $Q_{36}$ is connected in electrical parallel with inverter FET $Q_3$ between electrical junctions 8 and 84, whereby the conduction paths of compensating FETs $Q_{35}$ and $Q_{36}$ are connected in electrical series relative to one another. The gate electrodes of FETs $Q_{35}$ and $Q_{36}$ are connected together at electrical junction 8. The conduction path of a third compensating FET $Q_{37}$ is connected in electrical parallel with inverter FET $Q_4$ between electrical junctions 82 and 6. The conduction path of a fourth compensating FET $Q_{38}$ is connected in electrical parallel with inverter FET $Q_5$ between electrical junctions 6 and 84, whereby the conduction paths of compensating FETs $Q_{37}$ and $Q_{38}$ are connected in electrical series relative to one another. The gate electrodes of FETs $Q_{37}$ and $Q_{38}$ are connected together at electrical junction 6. In a preferred embodiment, FETs $Q_{35}$ and $Q_{37}$ are p-channel transistor devices, while FETs $Q_{36}$ and $Q_{38}$ are n-channel transistor devices. The conduction path of a first additional FET $Q_1$ is connected between the relatively positive source of supply voltage $V_{DD}$ and the electrical junction 82. The gate electrode FET $Q_1$ is connected to clock terminal means to receive the $\bar{\phi}$ clock signal. The conduction path of a second additional FET $Q_6$ is connected between the electrical junction 84 and the source of relatively negative supply voltage $V_{SS}$. The gate electrode of FET $Q_6$ is connected to clock terminal means to receive the $\phi$ clock signal. In operation, each cross-coupled inverter-amplifier stage 2 and 4 functions as a well known source follower to provide compensation for the logic level signals applied to the electrical junctions 6 and 8.

Figure 9:
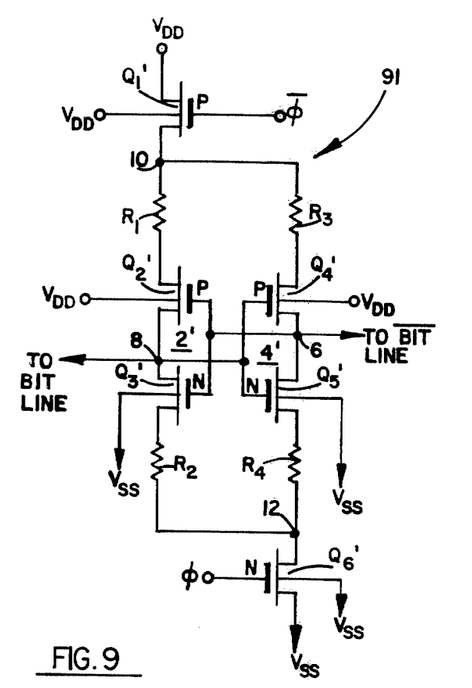
FIGS. 9-11 each show a CMOS sense amplifier that utilizes the body effect on field effect transistor device threshold voltage to automatically compensate for non-uniformities occurring as a result of device processing or exposure to a nuclear radiation event.

In another embodiment of the present invention, the body or back gate bias effect on MOS device threshold voltage is employed for self-compensation, as illustrated by the sense amplifier 91 in FIG. 9. The sense amplifier 91 is identical to that illustrated and previously disclosed when referring to FIG. 2, except that the respective floating body nodes (inherently formed between the conduction path electrodes and under the channel region of a MOSFET) of each of the p-channel FETs $Q_1'$, $Q_2'$, and $Q_4'$ are connected to the relatively positive source of supply voltage $V_{DD}$. The respective body nodes of each of the n-channel FETs $Q_3'$, $Q_5'$, and $Q_6'$ are connected to the relatively negative source of supply voltage $V_{SS}$. In a preferred embodiment, FETs $Q_1'$, $Q_2'$, $Q_3'$, $Q_4'$, $Q_5'$, and $Q_6'$ are each fabricated by conventional silicon on sapphire (SOS) techniques.

The operation of the self-compensating sense amplifier 91 of FIG. 9 is briefly described as follows. Under ideal operating conditions, the drain currents in each of FETs $Q_3'$ and $Q_5'$ are identical. However, should the drain current of FET $Q_3'$ exceed that of FET $Q_5'$ due to an unbalance, such as that caused by a parameter non-uniformity or by a nuclear radiation event, the corresponding source voltage of FET $Q_3'$, is increased relative to that of FET $Q_5'$. As a result, the difference between the source voltage of FET $Q_3'$ and the source of negative supply voltage $V_{SS}$ (which is connected to the body node of FET $Q_3'$) is, accordingly, increased. Because of the well known body effect or back gate bias effect, the threshold voltage of FET $Q_3'$ is also increased, thereby causing a decrease in the difference between the gate voltage and threshold voltage of FET $Q_3'$. Hence, the drain current of FET $Q_3'$ is diminished. What is more, due to similar, but opposing effects, the drain current of FET $Q_5'$ is increased. Therefore, by virtue of the self-compensating sense amplifier 91, the drain currents of each of FETs $Q_3'$ and $Q_5'$ are approximately equalized. Moreover, the value of the resistors $R_1$–$R_4$ is virtually independent of the radiation level that results from a nuclear event.

Figure 10:
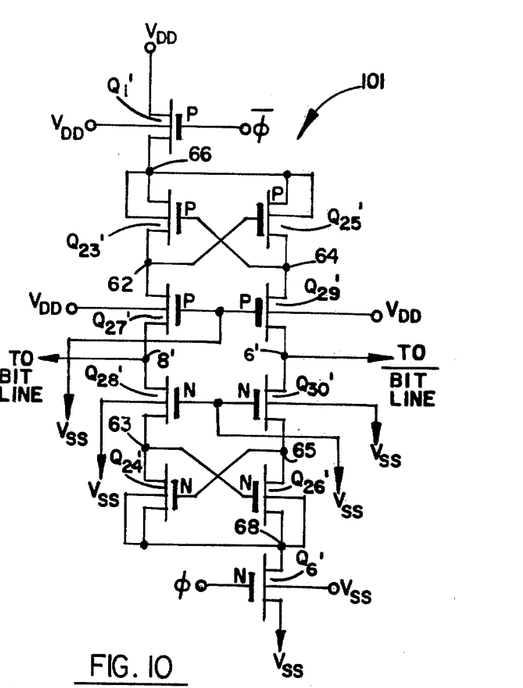

Another self-compensating sense amplifier configuration 101 that utilizes the body effect on MOS transistor device threshold voltages is shown in FIG. 10. The self-compensating sense amplifier 101 is identical to that illustrated and previously disclosed while referring to FIG. 6, except for the connections of the inherently formed body nodes of each of the MOSFETs. More particularly, the respective body nodes of p-channel FETs $Q_1'$, $Q_{27}'$, and $Q_{29}'$ are each connected to the relatively positive source of supply voltage $V_{DD}$. The respective body nodes of each of the p-channel compensating FETs $Q_{23}'$ and $Q_{25}'$ could be connected together at electrical junction 66, as shown, or connected to the source of positive supply voltage $V_{DD}$ when bulk CMOS fabrication techniques are employed. The respective body nodes of the n-channel FETs $Q_6'$, $Q_{28}'$, and $Q_{30}'$ are connected to the relatively negative source of supply voltage $V_{SS}$. The respective body nodes of each of the n-channel compensating FETs $Q_{24}'$ and $Q_{26}'$ could be connected together at the electrical junction 68, as shown, or connected to the source of negative supply voltage $V_{SS}$ when bulk CMOS fabrication techniques are employed. In a preferred embodiment, FETs $Q_1'$, $Q_6'$, $Q_{23}'$, $Q_{24}'$, $Q_{25}'$, $Q_{26}'$, $Q_{27}'$, $Q_{28}'$, $Q_{29}'$, and $Q_{30}'$ are each fabricated by conventional silicon on sapphire techniques.

The operation of the self-compensating sense amplifier 101 of FIG. 10 is briefly described as follows. The threshold voltages of MOSFET devices (e.g. FETs $Q_{28}'$ and $Q_{30}'$) depend upon the substrate (body) bias thereof, and, by changing the sourcebody voltage of these MOS devices, any current difference therethrough can be compensated by the respective body-source voltages. Under ideal operating conditions, the drain currents in each of FETs $Q_{28}'$ and $Q_{30}'$ are identical. However, should the drain current of FET $Q_{28}'$ exceed that of $Q_{30}'$ due to an unbalance, such as that caused by a nuclear radiation event, the corresponding voltage at electrical junction 63 exceeds that at electrical junction 65. As a result, the body-source voltage of FET $Q_{28}'$ exceeds that of FET $Q_{30}'$, and, accordingly, the source-drain resistance of FET $Q_{28}'$ is increased, while the source-drain resistance of FET $Q_{30}'$ is decreased. Hence, the sum of the resistance of the series connected FETs $Q_{28}'$ and $Q_{24}'$ approximates that of the series connected FETs $Q_{30}'$ and $Q_{26}'$. Therefore, by virtue of the self-compensating sense amplifier 101, the drain currents of each of FETs $Q_{28}'$ and $Q_{30}'$ are approximately equalized.

Figure 11:
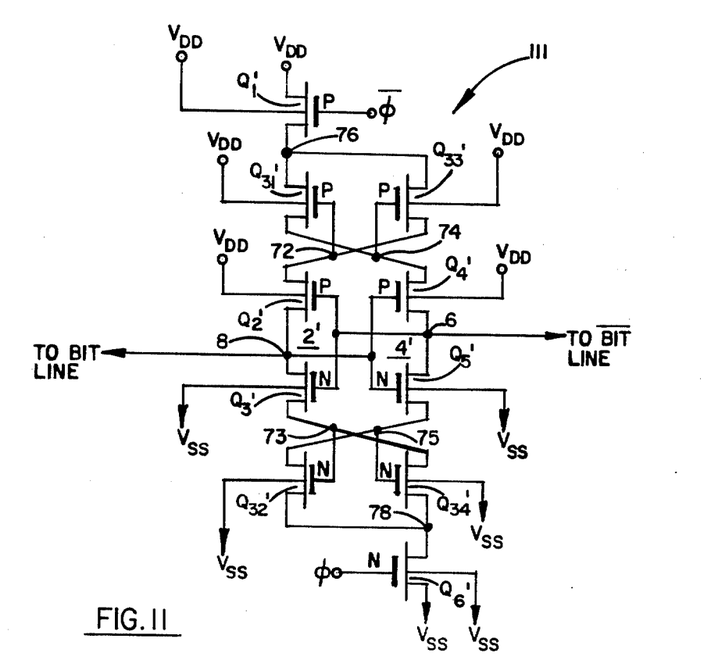

Another self-compensating sense amplifier configuration 111 that utilizes the body effect on MOS transistor device threshold voltages is shown in FIG. 11. The sense amplifier 111 is identical to that illustrated and disclosed when referring to FIG. 7, except for the connections of the inherently formed body nodes of each of the MOSFETs. More particularly, the respective body nodes of each of the p-channel FETs $Q_1'$, $Q_2'$, $Q_4'$, $Q_{31}'$, and $Q_{33}'$ are connected to the relatively positive source of supply voltage $V_{DD}$. Moreover, the respective body nodes of each of the n-channel FETs $Q_3'$, $Q_5'$, $Q_6'$, $Q_{32}'$, and $Q_{34}'$ are connected to the relatively negative source of supply voltage $V_{SS}$. In a preferred embodiment, each of FETs $Q_1'$, $Q_2'$, $Q_3'$, $Q_4'$, $Q_5'$, $Q_6'$, $Q_{31}'$, $Q_{32}'$, $Q_{33}'$, and $Q_{34}'$ is fabricated by conventional silicon on sapphire techniques. Inasmuch as the principle of operation of the sense amplifier 111 of FIG. 11 to compensate for undesirable unbalances is similar to that of the sense amplifier 101 illustrated in FIG. 10, a description of the operation of the self-compensating sense amplifier 111 is omitted.

It will be apparent that while a preferred embodiment of the invention has been shown and described, various changes and modifications may be made without departing from the true spirit and scope of the invention. For example, although the presently disclosed sense amplifiers are preferably fabricated from MOSFET devices, it is to be understood that either metal insulated semiconductor (MIS), junction field effect transistor (JFET), or bipolar devices may also be suitably employed to mechanize the instant sense amplifiers.

Having thus set forth a preferred embodiment of the invention, what is claimed is:

1. A sense amplifier that compensates for the effects of electrical parameter non-uniformities occurring therein, said sense amplifier comprising:
 first and second sources of supply voltage,
 first and second inverter-amplifier stages, each of said inverter-amplifier stages comprising a pair of transistor devices having respective conduction path electrodes and control electrodes,
 the conduction path electrodes of each of said first inverter-amplifier stage pair of transistor devices connected in electrical series with one another, and the control electrodes of each of said first inverter-amplifier stage pair of transistor devices connected to one another and to said second inverter-amplifier stage,
 the conduction path electrodes of each of said second inverter-amplifier stage pair of transistor devices connected in electrical series with one another, and the control electrodes of each of said second inverter-amplifier stage pair of transistor devices connected to one another and to said first inverter-amplifier stage,
 a plurality of compensating devices including:
  first compensating devices respectively connected in electrical series with each of said first transistor devices that form said first and second inverter-amplifier stages, and
  second compensating devices respectively connected in electrical series with each of the second transistor devices that form said first and second inverter-amplifier stages,
 coupling means to selectively connect said first and second inverter-amplifier stages to a supply of information signals, and
 first and second additional transistor devices, each of said additional transistor devices having a respective control electrode and conduction path electrodes,
 said first additional transistor device connected between said first source of supply voltage and a first transistor device of each of the pairs of transistor devices that form said first and second inverter-amplifier stages,
 said second additional transistor device connected between said second source of supply voltage and the second transistor device of each of the pairs of transistor devices that form said first and second inverter-amplifier stages,
 the respective control electrodes of said first and second additional transistor devices connected to receive enabling signals to control the conductivities thereof.

2. The compensating sense amplifier recited in claim 1, wherein the first transistor device of each of the pairs of transistor devices that form said first and second inverter-amplifier stages and said first additional transistor device is a p-channel field effect transistor, and the second transistor device of each of the pairs of transistor devices that form said first and second inverter-amplifier stages and said second additional transistor device is an n-channel field effect transistor.

3. The compensating sense amplifier recited in claim 2, wherein the first and second field effect transistors of each of said pairs of transistor devices that form said first and second inverter-amplifier stages are fabricated so as to have a body node formed therein, the respective body nodes of each of the first transistors of the pairs of field effect transistors that form said first and second inverter-amplifier stages connected to said first source of supply voltage, and the respective body nodes of each of the second transistors of the pairs of field effect transistors that form said first and second inverter-amplifier stages connected to said second source of supply voltage.

4. The compensating sense amplifier recited in claim 3 wherein the first and second field effect transistors of each of said pairs of transistor devices that form said first and second inverter-amplifier stages are fabricated to include a layer of silicon on a sapphire substrate.

5. The compensating sense amplifier recited in claim 1 wherein said first additional transistor device is a p-channel field effect transistor that is fabricated so as to have a body node formed therein, said body node connected to said first source of supply voltage, and said second additional transistor device is an n-channel field effect transistor that is fabricated so as to have a body node formed therein, said last mentioned body node connected to said second source of supply voltage.

6. The compensating sense amplifier recited in claim 5 wherein each of said first and second additional transistor devices is fabricated to include a layer of silicon on a sapphire substrate.

7. The compensating sense amplifier recited in claim 1 wherein each of the first transistor devices that form said first and second inverter-amplifier stages are identically sized with respect to one another and each of the second transistor devices that form said first and second inverter-amplifier stages are identically sized with respect to one another.

8. The compensating sense amplifier recited in claim 1 wherein each of said first and second compensating devices are resistors.

9. The compensating sense amplifier recited in claim 1 wherein each of the first and second compensating devices are field effect transistors, each of said compensating field effect transistors including a pair of conduction path electrodes and a control electrode.

10. The compensating sense amplifier recited in claim 9, wherein the first compensating field effect transistor that is connected in series with the first transistor device of said first inverter-amplifier stage has its control electrode and one conduction path electrode respectively cross-connected to one conduction path electrode and the control electrode of the first compensating field effect transistor that is connected in series with the first transistor device of said second inverter-amplifier stage, and the second compensating field effect transistor that is connected in series with the second transistor device of said first inverter-amplifier stage has its control electrode and one conduction path electrode respectively cross-connected to one conduction path electrode and the control electrode of the second compensating field effect transistor that is connected in series with the second transistor device of said second inverter-amplifier stage.

11. The compensating sense amplifier recited in claim 9, wherein the respective control electrodes of the first compensating field effect transistor that is connected in series with the first transistor device of said first inverter-amplifier stage and the first compensating field effect transistor that is connected in series with the first transistor device of said second inverter-amplifier stage are connected together to receive a first clock control signal, and the respective control electrodes of the second compensating field effect transistor that is connected in series with the second transistor device of said first inverter-amplifier stage and the second compensating field effect transistor that is connected in series with the second transistor device of said second inverter-amplifier stage are connected together to receive a second clock control signal.

12. The compensating sense amplifier recited in claim 9, wherein each of said first compensating devices are p-channel field effect transistors, and each of said second compensating devices are n-channel field effect transistors.

13. The compensating sense amplifier recited in claim 9, wherein each of said first compensating field effect transistors and each of said second compensating field effect transistors are fabricated so as to have a body node formed therein, each of the respective body nodes of the first compensating field effect transistors connected to said first source of supply voltage, and each of the respective body nodes of the second field effect transistors connected to said second source of supply voltage.

14. The compensating sense amplifier recited in claim 13, wherein each of said first and second compensating field effect transistors is fabricated to include a layer of silicon on a sapphire substrate.

15. A sense amplifier that compensates for the effects of electrical parameter non-uniformities occurring therein, said sense amplifier comprising:

first and second sources of supply voltage, first and second inverter-amplifier stages, each of said inverter-amplifier stages comprising a pair of transistor devices having respective conduction path electrodes and control electrodes, the conduction path electrodes of each of said first inverter-amplifier stage pair of transistor devices connected in electrical series with one another and the control electrodes of each of said first inverter-amplifier stage pair of transistor devices connected to one another and to said second inverter-amplifier stage, the conduction path electrodes of each of said second inverter-amplifier stage pair of transistor devices connected in electrical series with one another and the control electrodes of each of said second inverter-amplifier stage pair of transistor devices connected to one another and to said first inverter-amplifier stage, a plurality of compensating devices connected therein, including:

first compensating devices respectively connected in electrical parallel with each of said first transistor devices that form said first and second inverter-amplifier stages, and second compensating devices respectively connected in electrical parallel with each of said second transistor devices that form said first and second inverter-amplifier stages.

16. The compensating sense amplifier recited in claim 15, wherein each of said first compensating devices is a p-channel field effect transistor, and each of the second compensating devices is an n-channel field effect transistor.

17. A sense amplifier that automatically compensates for the effects of electrical parameter non-uniformities occurring therein, said sense amplifier comprising:

first and second sources of supply voltage, first and second inverter-amplifier stages, each of said inverter-amplifier stages comprising first and second transistor devices having a respective control electrode and a pair of conduction path electrodes, the conduction path electrodes of said first inverter-amplifier stage transistor devices connected in electrical series with one another and the conduction path electrodes of said second inverter-amplifier stage transistor devices connected in electrical series with one another, coupling means to connect said first and second inverter-amplifier stages to a supply of information signals, first and second pairs of compensating transistor devices, each of said compensating transistor devices having a respective control electrode and a pair of conduction path electrodes, the conduction path electrodes of a first compensating transistor device of each of said first and second pairs thereof respectively connected in electrical series with the conduction path electrodes of the first transistor device of each of said first and second inverter-amplifier stages, the conduction path electrodes of the second compensating transistor device of each of the first and second pairs thereof respectively connected in electrical series with the conduction path electrodes of the second transistor device of each of said first and second inverter-amplifier stages, and first and second additional transistor devices, each of said additional transistor devices having a respective control electrode and a pair of conduction path electrodes, the conduction path electrodes of said first additional transistor device connected between said first source of supply voltage and one conduction path electrode of each of the first compensating transistor devices, the conduction path electrodes of said second additional transistor device connected between said second source of supply voltage and one conduction path electrode of each of the second compensating transistor devices, the control electrodes of said first and second additional transistor devices connected to receive respective clock control signals to control the conductivities thereof.

18. The compensating sense amplifier recited in claim 17, wherein each of the first transistor devices of said first and second inverter-amplifier stages, each of the first compensating transistor devices of said first and second pairs thereof, and said first additional transistor device is a p-channel field effect transistor.

19. The compensating sense amplifier recited in claim 18, wherein each of the second transistor devices of said first and second inverter-amplifier stages, each of the second compensating transistor devices of said first and second pairs thereof, and said second additional transistor device is an n-channel field effect transistor.

20. The compensating sense amplifier recited in claim 19, wherein each of said p and n-channel field effect are fabricated from a layer of silicon on a sapphire substrate.

21. The compensating sense amplifier recited in claim 17 wherein the control electrode and one conduction path electrode of the first compensating transistor device of the first pair of compensating transistor devices are respectively cross-connected to one conduction path electrode and the control electrode of the first compensating transistor device of the second pair of compensating transistor devices, and the control electrode and one conduction path electrode of the second compensating transistor device of the first pair of compensating transistor devices are respectively cross-connected to one conduction path electrode and the control electrode of the second compensating transistor device of the second pair of compensating transistor devices.

22. The compensating sense amplifier recited in claim 21, wherein each of the transistor devices that form said first and second inverter-amplifier stages and each of the compensating transistor devices that form the first and second pairs thereof are fabricated so as to have a respective body mode formed therein, the respective body nodes of each of the first transistor devices that form said first and second inverter-amplifier stages connected to said first source of supply voltage, and the respective body nodes of each of the second transistor devices that form said first and second inverter-amplifier stages connected to said second source of supply voltage.

23. The compensating sense amplifier recited in claim 22, wherein each of the transistor devices that form said first and second inverter-amplifier stages and each of the compensating devices that form the first and second pairs thereof are fabricated to include a layer of silicon on a sapphire substrate.

24. The compensating sense amplifier recited in claim 17, wherein the respective control electrodes of the first compensating transistor devices of each of said first and second pairs thereof are connected together to receive a first clock control signal, and the respective control electrodes of the second compensating transistor devices of each of said first and second pairs thereof are connected together to receive a second clock control signal.

25. The compensating sense amplifier recited in claim 24, wherein the respective control electrodes of each of the first and second transistor devices that form said first inverter-amplifier stage are connected together and to said coupling means to receive information signals, and one conduction path electrode of each of said first and second transistor devices that form said first inverter-amplifier stage are connected together to form a first output, and the respective control electrodes of each of the first and second transistor devices that form said second inverter-amplifier stage are connected together and to said coupling means to receive information signals, and one conduction path electrode of each of said first and second transistor devices that form said second inverter-amplifier stage are connected together to receive the first clock control signal.

26. A sense amplifier that automatically compensates for the effects of electrical parameter non-uniformities occurring therein, said sense amplifier comprising:

first and second sources of supply voltage, first and second amplifier stages, each of said amplifier stages comprising first and second transistor devices having a respective control electrode and a pair of conduction path electrodes, the conduction path electrodes of said first amplifier stage transistor devices connected in electrical series with one another and the conduction path electrodes of said second amplifier stage transistor devices connected in electrical series with one another, coupling means to connect said first and second amplifier stages to a supply of information signals, first and second pairs of compensating transistor devices, each of said compensating transistor devices having a respective control electrode and a pair of conduction path electrodes, the conduction path electrodes of a first compensating transistor device of each of the first and second pairs thereof respectively connected in electrical series with the conduction path electrodes of the first transistor device of each of said first and second amplifier stages, the conduction path electrodes of the second compensating transistor device of each of the first and second pairs thereof connected in electrical series with the conduction path electrodes of the second transistor device of each of said first and second amplifier stages, the control electrodes of each of the transistor devices that form said first and second amplifier stages connected together and to a first of said sources of supply voltage, the control electrode and one conduction path electrode of said first compensating transistor device that is connected in series with the first transistor device of said first amplifier stage respectively cross-connected to one conduction path electrode and the control electrode of said first compensating transistor device that is connected in series with the first transistor device of said second amplifier stage, and the control electrode and one conduction path electrode of said second compensating transistor device that is connected in series with the second transistor device of said first amplifier stage respectively cross-connected to one conduction path electrode and the control electrode of said second compensating transistor device that is connected in series with the second transistor device of said second amplifier stage.

27. The compensating sense amplifier recited in claim 26, including first and second additional transistor devices having a respective control electrode and a pair of conduction path electrodes, the conduction path electrodes of said first additional transistor device connected between said first source of supply voltage and one conduction path electrode of each of said second compensating transistor devices, the conduction path electrodes of said second additional transistor device connected between said second source of supply voltage and one conduction path electrode of each of said first compensating transistor devices, and the control electrodes of said first and second additional transistor devices connected to receive respective clock control signals to control the conductivities thereof.

28. The compensating sense amplifier recited in claim 26, wherein each of said first and second transistor devices of the first and second amplifier stages, said first and second pairs of compensating transistor devices, and said first and second additional transistor devices are fabricated from a layer of silicon on a sapphire substrate so as to have a respective body node formed therein.

29. The compensating sense amplifier recited in claim 28, wherein each of the body nodes of said first and second pairs of compensating transistor devices is respectively connected in a feedback relationship to one conduction path electrode thereof.

30. The compensating sense amplifier recited in claim 28, wherein the body nodes of each of said first additional transistor device and said second transistor devices that form said first and second amplifier stages respectively connected to said first source of supply voltage, and the body nodes of each of said second additional transistor device and said first transistor devices that form said first and second amplifier stages respectively connected to said second source of supply voltage.

* * * * *